United States Patent
Magoon et al.

(10) Patent No.: US 7,894,546 B2
(45) Date of Patent: Feb. 22, 2011

(54) REPLICA LINEARIZED POWER AMPLIFIER

(75) Inventors: Rahul Magoon, Irvine, CA (US); Roberto Aparicio Joo, Newport Beach, CA (US); Scott D. Kee, Dana Point, CA (US); Ichiro Aoki, San Clemente, CA (US)

(73) Assignee: Axiom Microdevices, Inc., Woburn, MA (US)

( * ) Notice: Subject to any disclaimer, the term of this patent is extended or adjusted under 35 U.S.C. 154(b) by 0 days.

(21) Appl. No.: 11/771,156

(22) Filed: Jun. 29, 2007

(65) Prior Publication Data

US 2008/0031383 A1    Feb. 7, 2008

Related U.S. Application Data

(60) Provisional application No. 60/835,739, filed on Aug. 4, 2006.

(51) Int. Cl.
*H04L 25/06* (2006.01)
*H04L 25/49* (2006.01)

(52) U.S. Cl. .................. 375/296; 375/318; 375/297; 375/317

(58) Field of Classification Search ........... 375/317, 375/318, 296, 297, 345; 330/252, 84, 85; 327/52
See application file for complete search history.

(56) References Cited

U.S. PATENT DOCUMENTS

| | | | | |
|---|---|---|---|---|
| 5,406,220 A * | 4/1995 | Jones et al. | ........... | 330/253 |
| 7,288,991 B2 * | 10/2007 | Ripley | ........... | 330/285 |
| 7,336,127 B2 * | 2/2008 | Kennan | ........... | 330/124 R |
| 2004/0151039 A1 * | 8/2004 | Lee et al. | ........... | 365/200 |
| 2004/0162039 A1 * | 8/2004 | Marque-Pucheu | ........... | 455/126 |
| 2005/0046507 A1 * | 3/2005 | Dent | ........... | 332/103 |
| 2006/0077004 A1 | 4/2006 | Groe | | |
| 2006/0132177 A1 | 6/2006 | Brooks | | |
| 2007/0146090 A1 * | 6/2007 | Carey et al. | ........... | 332/112 |

FOREIGN PATENT DOCUMENTS

| | | |
|---|---|---|
| EP | 0408137 A | 1/1991 |
| WO | WO2004112242 A | 12/2004 |

* cited by examiner

*Primary Examiner*—David C Payne
*Assistant Examiner*—Linda Wong

(57) ABSTRACT

A power amplifier includes a power amplifier core in which a transmit signal having an amplitude-modulated (AM) component and a phase-modulated (PM) component is passed and amplified, the power amplifier comprising a forward path, and an additional amplification device configured to generate an output that is proportional to an output of the power amplifier core, such that the output of the additional amplification device indirectly controls the output of the power amplifier core.

17 Claims, 5 Drawing Sheets

REPLICA LINEARIZED POWER AMPLIFIER

CROSS REFERENCE TO RELATED APPLICATION

This application claims priority to co-pending U.S. provisional application entitled, "A Robust, Low Delay, Replica Linearized Power Amplifier Implementation Using Corrective Feedback For Amplitude and Phase Control," having Ser. No. 60/835,739, filed on Aug. 4, 2006, and which is entirely incorporated herein by reference. This application is also related to co-pending, commonly assigned U.S. patent application entitled "System And Method or Low Delay Corrective Feedback Power Amplifier control" having Ser. No. 11/771,130, filed on even date herewith.

BACKGROUND

Portable communication devices such as cellular-type telephones or other communication devices are becoming more widespread. A portable communication device includes one or more power amplifiers for amplifying the power of the signal to be transmitted from the portable communication device.

With the decreasing size of portable communication devices, power efficiency is one of the most important design criteria. Reducing power consumption prolongs power source life and extends stand-by and talk time of the portable communication device.

A portable communication device may employ a constant or a non-constant envelope modulation methodology. A non-constant envelope modulation scheme is typically implemented with a linear power amplifier. The entire amplitude and phase modulated waveform is provided to the input of the power amplifier and the power amplifier amplifies the combined signal. In a non-constant envelope modulation scheme, "power control" can be implemented as a "slow loop" regulating the gain of the power amplifier or adjusting the input amplitude to compensate for gain variation in the power amplifier that occurs due to process and temperature variations. Unfortunately, a linear power amplifier is significantly less efficient than a nonlinear power amplifier and, as such, consumes more power.

In the case where both a constant envelope modulation methodology and a non-constant envelope modulation methodology are employed, such as in a communication device that operates using the Global System for Mobile Communication (GSM) and the Enhanced Data Rates for GSM Evolution (EDGE) communication formats, it is desirable to use the same power amplifier for both signals. The GSM system provides a slightly higher output power and uses a constant-envelope modulation methodology. The EDGE system uses a non-constant-envelope modulation methodology. If a linear power amplifier is used to implement EDGE, then the power amplifier is less efficient when operated in GSM mode. This is why it is desirable to find a way to make a non-linear power amplifier work in EDGE mode.

Polar modulation is a known technique of performing non-constant envelope modulation using a nonlinear power amplifier. In polar modulation, a phase modulated input signal is applied to the radio frequency (RF) input to the power amplifier. The output power of the power amplifier is adjusted at the rate of the amplitude modulation to recompose the modulated waveform at the output of the power amplifier.

GSM systems have traditionally been implemented using nonlinear power amplifiers, with the "power control" implemented as a (slow) gain modulation in the power amplifier. A "power control" signal is supplied to the power amplifier from the baseband subsystem to implement the time-slotting (ramp up power at the beginning of the time slot, ramp it down at the end) of the communication protocol using this slow gain modulation. One prior attempt at implementing a power amplifier in the EDGE system using polar modulation increases the performance of the "power control" signal, so that the power amplifier output power can be changed rapidly to create the modulation and to create the power control (i.e. there is still the slow ramp up and ramp down at the edges of the slot, but the faster modulation is also added in the middle). In this manner, the power amplifier can still be used in GSM mode by applying a signal to the "power control" port with only the ramping signals, while also performing polar modulation in EDGE mode.

There are two kinds of polar modulation: open-loop and closed-loop. In open loop, there is no feedback path for the power amplifier output. In closed-loop, feedback on the amplitude and phase paths is used to measure the output amplitude and phase. The measured amplitude and phase are compared to a desired signal, and then an amplitude and gain correcting mechanism is used to minimize any discrepancy. This is difficult because you have to keep a very wide bandwidth and, meet noise, and not have the system go unstable and oscillate even under output mismatch, for example, in the presence of a voltage standing wave ratio (VSWR).

In such a system, the phase modulation is typically applied directly to the signal input of the power amplifier. The phase is controlled using a phase correction feedback loop.

One of the challenges when implementing a so called "polar modulation" technique is that the amplitude modulation (AM) signal distorts the phase modulation (PM) signal and the AM signal becomes distorted because of the nonlinearities of the power amplifier. This may lead to power amplifier saturation, resulting in a situation in which the power amplifier output no longer responds linearly to a power control signal. This condition is worsened when the power amplifier is presented with a mismatched load, caused by, for example, movement of the antenna. Further, it is desirable to maintain a linear control over the output of the power amplifier in order to keep the bandwidth of the control loop constant.

Therefore, it is desirable to have a power amplifier control scheme that minimizes the possibility of power amplifier saturation.

SUMMARY

Embodiments of the replica linearized power amplifier include a power amplifier, including a power amplifier core in which a transmit signal having an amplitude-modulated (AM) component and a phase-modulated (PM) component is passed and amplified, the power amplifier comprising a forward path, and an additional amplification device configured to generate an output that is proportional to an output of the power amplifier core, such that the output of the additional amplification device indirectly controls the output of the power amplifier core.

Related embodiments and methods of operation are also provided. Other systems, methods, features, and advantages will be or become apparent to one with skill in the art upon examination of the following figures and detailed description. It is intended that all such additional systems, methods, features, and advantages be included within this description, be within the scope of the specification, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Figure 1:
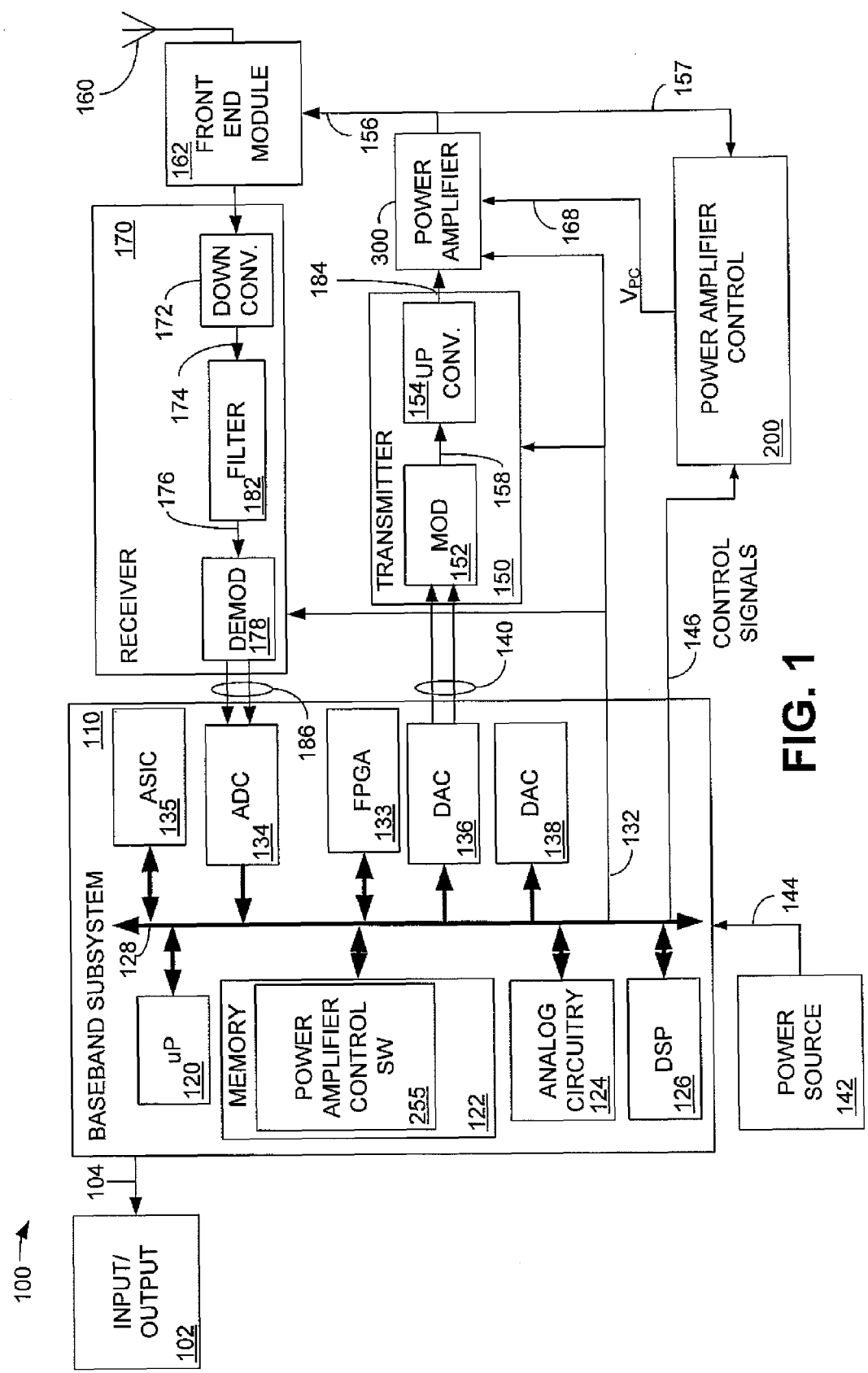
FIG. 1 is a block diagram illustrating a simplified portable transceiver including an embodiment of a replica linearized power amplifier.

Although described with particular reference to a portable transceiver, the replica linearized power amplifier can be implemented in any communication device in which it is desirable to maintain linear control of a power amplifier.

The replica linearized power amplifier can be implemented in hardware, software, or a combination of hardware and software. When implemented in hardware, the replica linearized power amplifier can be implemented using specialized hardware elements and logic. When the replica linearized power amplifier is implemented partially in software, the software portion can be used to control components in the power amplifier so that various operating aspects can be software-controlled. The software can be stored in a memory and executed by a suitable instruction execution system (microprocessor). The hardware implementation of the replica linearized power amplifier can include any or a combination of the following technologies, which are all well known in the art: discrete electronic components, a discrete logic circuit(s) having logic gates for implementing logic functions upon data signals, an application specific integrated circuit having appropriate logic gates, a programmable gate array(s) (PGA), a field programmable gate array (FPGA), etc.

The software for the replica linearized power amplifier comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer-readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

FIG. 1 is a block diagram illustrating a simplified portable transceiver 100 including an embodiment of a replica linearized power amplifier. The portable transceiver 100 includes an input/output (I/O) module 102. Depending on the type of portable transceiver, the input/output module 102 may include a speaker, a display, a keyboard, a microphone, a trackball, a touch pad, or any other user interface device. A power source 142, which may be a direct current (DC) battery or other power source, is also connected to the baseband subsystem 110 via connection 144 to provide power to the portable transceiver 100. In a particular embodiment, portable transceiver 100 can be, for example but not limited to, a portable telecommunication device such as a mobile cellular-type telephone. The power source 142 might be connected directly to other parts of the transceiver as well, for example the receiver 170, the transmitter 150, and/or the power amplifier 300.

The baseband subsystem 110 includes a microprocessor (µP) 120, a memory 122, analog circuitry 124, and digital signal processor (DSP) 126 in communication via bus 128. Bus 128, although shown as a single bus, may be implemented using multiple busses connected to provide a physical connection and a logical connection among the subsystems within baseband subsystem 110.

Depending on the manner in which the replica linearized power amplifier is implemented, the baseband subsystem 110 may also include one or more of an application specific integrated circuit (ASIC) 135 and a field programmable gate array (FPGA) 133.

Microprocessor 120 and memory 122 provide the signal timing, processing and storage functions for portable transceiver 100. Analog circuitry 124 provides the analog processing functions for the signals within baseband subsystem 110. Baseband subsystem 110 provides control signals to transmitter 150, receiver 170 power amplifier 300 and the power amplifier control element 200 such as through connection 132 for example.

The baseband subsystem 110 generates a power control signal that includes an amplitude-modulation (AM) component and provides the AM signal on connection 146 to the power amplifier control element 200. In practice, the functions of generating the power control signal and the AM signal can alternatively be integrated within other parts of the transceiver as well, for example in the transmitter 150 or in the power amplifier control element 200. The power control signal can be referred to as $V_{APC}$. The power control signal, $V_{APC}$, can be generated by the baseband subsystem 110 and is converted to an analog control signal by the digital-to-analog converter (DAC) 138. The power control signal, $V_{APC}$, is illustrated as being supplied from the bus 128 to indicate that the signal may be generated in different ways as known to those skilled in the art. The power control signal, $V_{APC}$, is a reference voltage signal that defines the transmit power level and provides the power profile. Generally, the power control signal, $V_{APC}$, controls the power amplifier as a function of the peak voltage of the power amplifier determined during calibration, and corresponds to power amplifier output power.

The control signals on connections 132 and 146 may originate from the DSP 126, the ASIC 135, the FPGA 133, or from microprocessor 120, and are supplied to a variety of connections within the transmitter 150, receiver 170, power amplifier 300, and the power amplifier control element 200. It should be noted that, for simplicity, only the basic components of the portable transceiver 100 are illustrated herein. The control signals provided by the baseband subsystem 110 control the various components within the portable transceiver 100. Further, the function of the transmitter 150 and the receiver 170 may be integrated into a transceiver.

As will be discussed below, the power amplifier control element 200 generates a power amplifier (PA) power control voltage, referred to as $V_{PC}$. The PA power control voltage, $V_{PC}$, controls the power output of the power amplifier 300 based on an amplitude reference signal of the AM signal component. The PA power control voltage, $V_{PC}$, is generated in a closed power control loop that is formed by the components in the power amplifier control element 200, which will be described below. In some embodiments the power control signal might be in the form of a current or a digital signal rather than an analog voltage. In an embodiment, the power control element 200 includes a plurality of power control loops that are configured to provide low delay corrective feedback to control the power output of the power amplifier 300, while minimizing the amount of AM and phase-modulation (PM) distortion at the output of the power amplifier 300.

If portions of the replica linearized power amplifier are implemented in software that is executed by the microprocessor 120, the memory 122 will also include power amplifier control software 255. The power amplifier control software 255 comprises one or more executable code segments that can be stored in the memory and executed in the microprocessor 120. Alternatively, the functionality of the power amplifier control software 255 can be coded into the ASIC 135 or can be executed by the FPGA 133, or another device. Because the memory 122 can be rewritable and because the FPGA 133 is reprogrammable, updates to the corrective feedback power control software 255 can be remotely sent to and saved in the portable transceiver 100 when implemented using either of these methodologies.

Baseband subsystem 110 also includes analog-to-digital converter (ADC) 134 and digital-to-analog converters (DACs) 136 and 138. In this example, the DAC 136 generates the in-phase (I) and quadrature-phase (Q) signals 140 that are applied to the modulator 152. Other embodiments are possible, for example by utilizing direct modulation of a phase locked loop (PLL) synthesizer or direct digital synthesizer (DDS). These methods are well-know to those skilled in the art. In this example the DAC 138 generates the power control signal, $V_{APC}$, on connection 146. ADC 134, DAC 136 and DAC 138 also communicate with microprocessor 120, memory 122, analog circuitry 124, DSP 126 and FPGA 133 via bus 128. DAC 136 converts the digital communication information within baseband subsystem 110 into an analog signal for transmission to a modulator 152 via connection 140. Connection 140, while shown as two directed arrows, includes the information that is to be transmitted by the transmitter 150 after conversion from the digital domain to the analog domain.

The transmitter 150 includes modulator 152, which modulates the analog or digital information on connection 140 and provides a modulated signal via connection 158 to upconverter 154. The upconverter 154 transforms the modulated signal on connection 158 to an appropriate transmit frequency and provides the up converted signal to a power amplifier 300 via connection 184. In alternative embodiments, the modulator 152 and the upconverter 154 can be combined into a single element that provides both functions simultaneously. The power amplifier 300 amplifies the signal to an appropriate power level for the system in which the portable transceiver 100 is designed to operate.

Details of the modulator 152 and the upconverter 154 have been omitted, as they will be understood by those skilled in the art. For example, the data on connection 140 is generally formatted by the baseband subsystem 110 into in-phase (I) and quadrature (Q) components. The I and Q components may take different forms and be formatted differently depending upon the communication standard being employed. For example, when the power amplifier 300 is used in a constant-amplitude, phase (or frequency) modulation application such as the global system for mobile communications (GSM), the phase modulated information is provided by the modulator 152. When the power amplifier 300 is used in an application requiring both phase and amplitude modulation such as, for example, extended data rates for GSM evolution, referred to as EDGE, the Cartesian in-phase (I) and quadrature (Q) components of the transmit signal are converted to their polar counterparts, amplitude and phase. The phase modulation is performed by the modulator 152, while the amplitude modulation is performed by the power amplifier control element 200, where the amplitude envelope is defined by the PA power control voltage $V_{PC}$, which is generated by the power amplifier control element 200. This technique is known as polar modulation.

The power amplifier 300 supplies the amplified signal via connection 156 to a front end module 162. The front end module 162 comprises an antenna system interface that may include, for example, a diplexer having a filter pair that allows simultaneous passage of both transmit signals and receive signals, as known to those having ordinary skill in the art. The transmit signal is supplied from the front end module 162 to the antenna 160.

A signal received by antenna 160 will be directed from the front end module 162 to the receiver 170. The receiver 170 includes a downconverter 172, a filter 182, and a demodulator 178. If implemented using a direct conversion receiver (DCR), the downconverter 172 converts the received signal from an RF level to a signal centered around baseband frequency (DC), or a near-baseband frequency (~100 kHz). Alternatively, the received RF signal may be downconverted to an intermediate frequency (IF) signal, depending on the application. The downconverted signal is sent to the filter 182 via connection 174. The filter comprises a least one filter stage to filter the received downconverted signal as known in the art.

The filtered signal is sent from the filter 182 via connection 176 to the demodulator 178. The demodulator 178 recovers the transmitted analog information and supplies a signal representing this information via connection 186 to ADC 134. ADC 134 converts these analog signals to a digital signal at baseband frequency and transfers the signal via bus 128 to DSP 126 for further processing.

Figure 2:
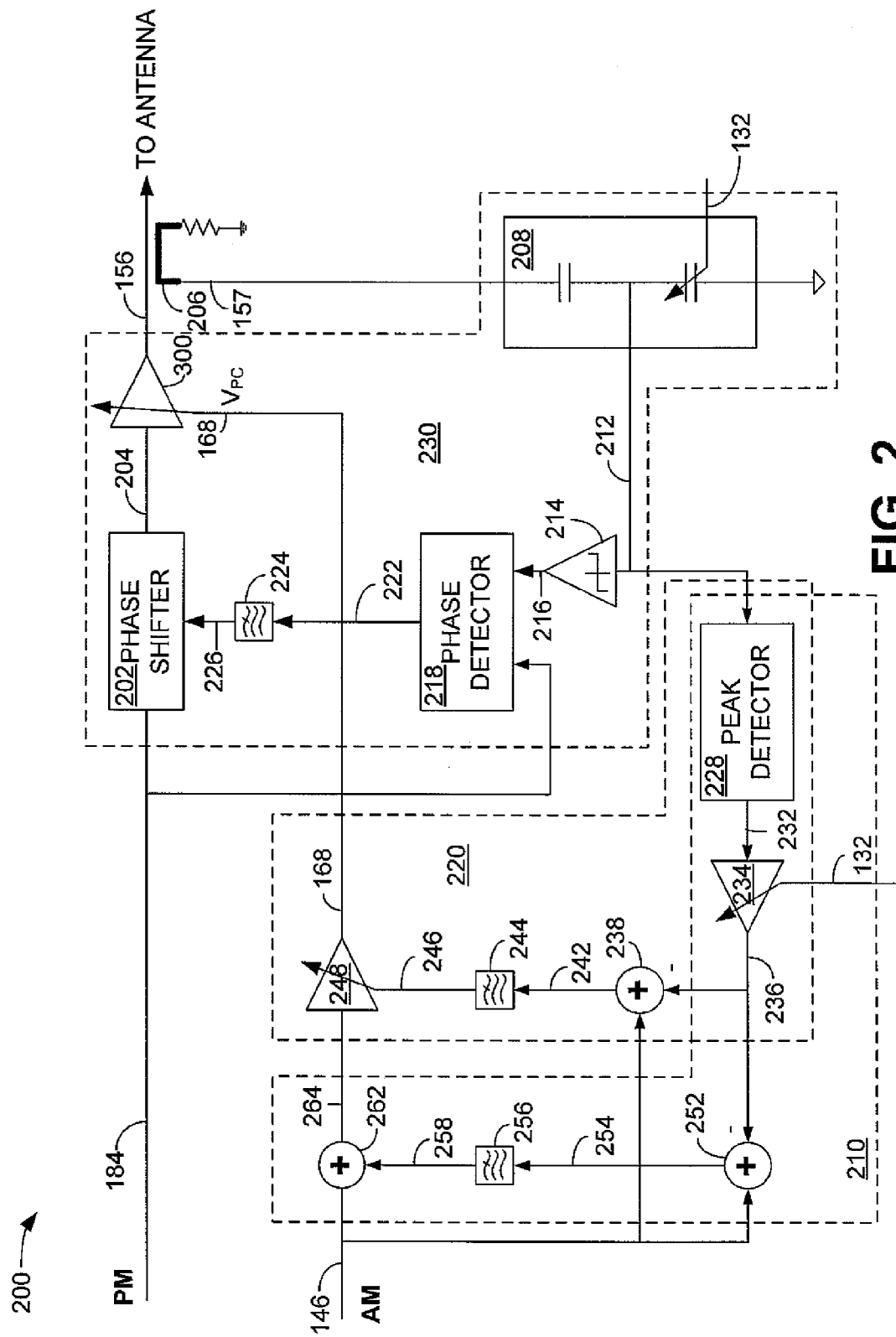
FIG. 2 is a block diagram illustrating an embodiment of the power amplifier control element of FIG. 1.

FIG. 2 is a block diagram illustrating an embodiment of the power amplifier control element 200 of FIG. 1. The power amplifier control element 200 controls the power output of the power amplifier 300, which receives a phase modulated (PM) signal via connection 184 and an amplitude modulation (AM) control signal via connection 146. In this embodiment, the AM and PM are independently controlled and are combined in the power amplifier circuitry. The AM signal on connection 146 is provided via the baseband subsystem 110 (FIG. 1) and is used as a control signal which impresses the AM on the control port of the power amplifier 300. The AM signal is used to control the power output of the power amplifier 300. The PM signal on connection 184 is a signal comprising a low-frequency phase modulation of the radio frequency RF carrier supplied to the RE input of the power amplifier 300.

However, applying the amplitude modulation to the control port of the power amplifier 300 can distort the phase portion of the signal through the power amplifier 300, such as if the phase delay of the power amplifier 300 changes with the control signal or the output level. Additionally, the output amplitude can be distorted relative to the desired output amplitude if the output amplitude of the power amplifier 300 does not accurately track the control signal 168. To minimize these phase and amplitude distortions, the power amplifier control element 200 comprises a phase correction loop (phase loop) 230 in addition to an outer AM correction loop (outer AM loop) 210, an inner AM correction loop (inner AM loop) 220. The inner and outer AM correction loops improve the linearity of the AM control of the power amplifier 300. The bandwidth of the outer AM correction loop 210 is larger than the bandwidth of the inner AM correction loop 220 by an approximate magnitude of 10. In an example using the EDGE modulation spectrum, the bandwidth of the outer AM correction loop 210 is approximately 2 megahertz (MHz) and the bandwidth of the inner AM correction loop 220 is approximately 200 kilohertz (kHz). The bandwidth of the phase correction loop 230 is approximately 2 MHz. The approximate decade difference among the outer AM correction loop 210 and the inner AM correction loop 220 helps to maintain the stability of the power amplifier control element 200.

In an embodiment, the power amplifier 300 is implemented using a power amplifier device having a linearized control circuit and methodology, which linearizes the amplitude control characteristic of the power amplifier 300. This power amplifier is also referred to as a "replica-linearized power amplifier," or a "replica-corrected power amplifier," as will be described below.

In an embodiment, the power amplifier 300, the outer AM correction loop 210, the inner AM correction loop 220 and the phase correction loop 230 are implemented on the same semiconductor die. In this manner, the response of the components is similar with respect to process and temperature variations.

A portion of the output of the power amplifier 300 on connection 156 is coupled by using, for example, an RF coupler 206 to connection 157. Alternately, other couplings can be used, such as a direct connection, capacitive division, voltage sense, current sense, or other couplings or combinations of couplings. The RF signal on connection 157 is provided to a variable attenuator 208. The variable attenuator 208 is controlled by a signal from the baseband subsystem 110 via connection 132. The control signal on connection 132 controls the amount of attenuation provided by the variable attenuator 208. The output of the variable attenuator 208 is provided via connection 212.

The outer AM correction loop 210 comprises a peak detector 228, a baseband variable gain amplifier (VGA) 234, an adder 252, a low pass filter 256 and an adder 262. The output of the variable attenuator on connection 212 is coupled to the peak detector 228. The peak detector 228 removes the RF portion of the signal from connection 212 and provides via connection 232 to the baseband VGA 234 a baseband signal that is proportional to the AM envelope of the RF signal on connection 212. The baseband VGA 234 is controlled by a signal via connection 132 from the baseband subsystem 110. The baseband VGA 234 adjusts the gain of the signal at connection 232 and provides an output via connection 236. The output of the baseband VGA 234 on connection 236 is provided to an adder 252. Another input to the adder 252 is the AM control signal on connection 146. The signal on connection 236 is subtracted from the AM control signal on connection 146 and the output of the adder 252 is provided via connection to 254 to the low pass filter 256. The low pass filter 256 may be a passive device or an active device having a frequency response and a gain value. The output of the low pass filter 256 on connection 258 is combined with the AM control signal on connection 146 in the adder 262. The output of the adder 262 is provided via connection 264 to the inner AM control loop 220.

The outer AM correction loop 210 operates at a wide bandwidth (in this example approximately 2 MHz) compared to the inner AM correction loop 220 and can correct offsets and distortion that can exist in the forward path through the power amplifier 300. The outer AM correction loop 210 also linearizes the control loop and corrects any AM control nonlinearity present in the power amplifier 300.

The inner AM correction loop 220 includes the peak detector 228, the baseband VGA 234, an adder 238, a low pass filter 244 and a VGA 248. While the baseband VGA 234 and the VGA 248 are shown as amplifiers, the baseband VGA 234 and the VGA 248 can be any variable gain elements. The output of the baseband VGA 234 on connection 236 is also provided to an adder 238. Another input to the adder 238 is the AM control signal on connection 146. The signal at connection 236 is subtracted from the signal on connection 146 and provided as an output of the adder 238 on connection 242. The signal on connection 242 is provided to the low pass filter 244, the output of which on connection 246 is used to control the gain of VGA 248. The low pass filter 244 may be a passive device or an active device having a frequency response and a gain value. The input to the VGA 248 is taken from the output of the adder 262. This signal on connection 264 represents the AM signal on connection 146 as corrected by the outer AM correction loop 210. The output of the VGA 248 on connection 168 is the control signal that is applied to the control port of the power amplifier 300 and includes the AM portion of the transmit signal. In this manner, the AM control signal on connection 146 is used to control the output power of the power amplifier 300 and is also used to impress the AM portion of the transmit signal.

The inner AM correction loop 220 employs multiplicative corrective feedback to allow the VGA 248 to compensate for gain changes in the forward path. The gain changes in the forward path may occur due to, for example, changing VSWR, etc. The outer AM correction loop 210 employs linear corrective feedback to correct offset and non-linearity in the forward path. The inner AM correction loop 220 maintains a constant bandwidth in the outer AM correction loop 210 by forcing the outer AM correction loop 210 to have a constant gain. Therefore, any impedance change at the output of the power amplifier 300, or any electrical change that affects the gain in the forward path, is canceled by the VGA 248. This forces the gain and bandwidth of the outer AM correction loop 210 to be constant. In this example, the bandwidth of the inner AM correction loop 220 is approximately 200 kHz. The VGA 248 maintains the bandwidth of the outer AM correction loop 210 at a constant value to maintain high bandwidth in the outer AM correction loop 210 while maintaining loop stability.

Even if the control input to the power amplifier 300 were to remain constant, changes that affect the output load of the power amplifier 300 would change the gain of the RF signal through the power amplifier 300, and thus change the gain between the control signal 168 and the detected signal 236. The correction bandwidth of outer AM correction loop 210 can be proportional to the gain of the feedback loop, including the gain through the power amplifier 300 and the VGA 248. Additionally, the stability of the outer AM correction loop 210 can be compromised if the loop gain is too high. Thus, it is important to keep the loop gain sufficiently high so as to correct any AM distortion, while keeping the loop gain low enough so as to ensure stability. Therefore the VGA 248 is used to correct gain variations in the power amplifier 300, maintaining a constant overall loop gain for the outer AM correction loop 210. Thus, using the inner AM correction loop 220 as a corrective feedback path allows stable control without restricting overall system bandwidth.

Due to the placement of the low pass filters 256 and 244 in the feedback paths instead of in the forward path, the forward bandwidth from the AM input signal on connection 146 to the power amplifier output on connection 156 is nearly independent of the response of both the inner and outer AM correction loops and is dependent only on the bandwidth of the power amplifier. In this manner, the feedback is corrective and not integrated, so changes to the forward path are made with a very low delay. The high bandwidth and low signal delay provided by the inner and outer AM correction loops provide accurate control of the power output of the power amplifier 300 using the VGA 248 and provide a highly linear control through the wide bandwidth outer AM correction loop 210.

The phase correction loop 230 includes the variable attenuator 208 a limiter 214, phase detector 218, a low pass filter 224 and a phase shifter 202. The output signal of the variable attenuator on connection 212 is provided to a limiter 214. The limiter 214 removes the AM portion of the signal from the output on connection 212 and provides an input to the phase detector 218. The other input to the phase detector 218 is the PM signal on connection 184. The phase detector 218 determines a difference between the phase of the signal on connection 216 and the phase of the signal on connection 184 and provides an error signal on connection 222 representing the difference. The error signal is provided to the low pass filter 224, which provides an output to the phase shifter on connection 226. The signal on connection 226 determines the extent to which the phase shifter 202 will shift the phase of the input signal on connection 184 and provide an appropriate PM input signal to the power amplifier 300 via connection 204.

The variable attenuator 208 provides coarse power control. By varying the attenuation of the feedback signal on connection 157, the variable attenuator 208 can control the output power of the power amplifier 300 through outer AM correction loop 210. The variable attenuator 208 also maximizes the range of the peak detector 228 range by keeping the operating point of the peak detector 228 relatively constant. The output power of the power amplifier 300 will settle to a level set by the outer AM correction loop 210. The baseband control signal on 132 determines the gain of the baseband VGA 234 and the closed loop control maintains the output of the baseband VGA 234 equal to the AM signal on connection 146. In an embodiment, the feedback signal to the inner and outer AM correction loops and the phase correction loop is provided from separate variable attenuators.

The AM control signal provided to the power amplifier 300 via connection 168 may change the phase delay characteristics of the power amplifier 300 and induces a phase change. One mechanism which can cause this effect is that the change in output power induced by the change in the control signal 168 can cause the phase delay to change due to the effect of AM/PM conversion in the power amplifier 300. The phase correction loop 230 provides a retarded or advanced phase of the signal on connection 184 to power amplifier 300 based on the error signal from the phase detector 218. The phase correction loop 230 does not alter the phase of the signal on connection 184 if phase distortion is not present.

The VGA 248 maintains the bandwidth of the outer AM correction loop 210 at a constant value to prevent the outer AM correction loop 210 from introducing phase shift in the control loop and instability when the AM control signal is used to control the power amplifier 300. This maintains a low delay and a high bandwidth characteristic in that a constant delay equates to a constant bandwidth. The forward bandwidth from the AM input signal on connection 146 to the power amplifier output on connection 156 is independent of the response of both the inner and outer AM feedback loops and is dependent only on the bandwidth of the power amplifier control input. In this manner, the feedback is corrective and not integrated, so changes to the forward path are made with a very low delay. The high bandwidth and low delay provided by the inner and outer AM correction loops provide accurate control of the power output of the power amplifier 300 using the VGA 248 and provide a highly linear control through the wide bandwidth outer AM correction loop 210.

The power amplifier 300, phase correction loop 230, the outer AM correction loop 210 and the inner AM correction loop 220 can be fabricated on the same semiconductor die. In this manner, the response of the components will be closely matched with respect to temperature and process.

Figures 3A, 3B:
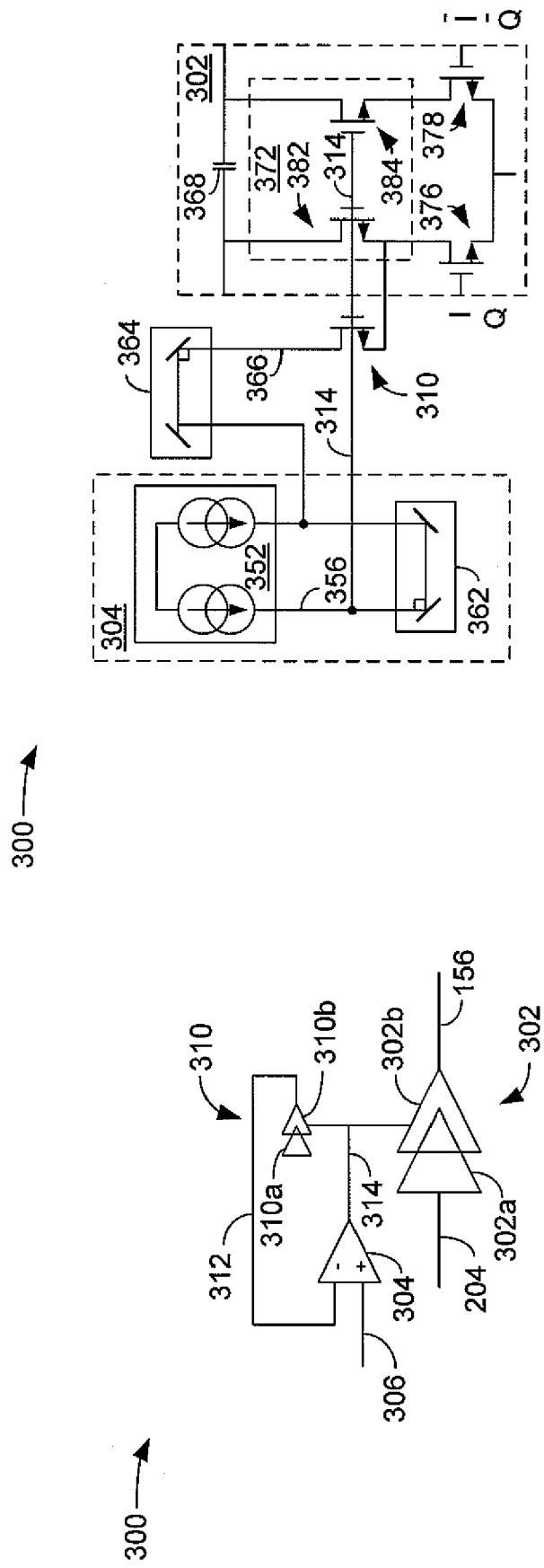
FIG. 3A is a schematic diagram illustrating an embodiment of the replica linearized power amplifier of FIG. 1.
FIG. 3B is a schematic diagram illustrating an example of an implementation of the replica linearized power amplifier of FIG. 3A.

FIG. 3A is a schematic diagram illustrating an embodiment of the replica linearized power amplifier 300 of FIG. 1. The replica linearized power amplifier 300 includes a power amplifier core 302 having a plurality of power amplifier core stages, referred to as 302a and 302b. However, the power amplifier core 302 may have more or fewer amplifier stages. The RF input to the power amplifier core 302 is via connection 204 and the output is via connection 156.

The replica linearized power amplifier 300 also includes an additional amplification device, referred to as a "replica device" 310 having a plurality of stages, illustrated here as 310a, and 310b. However, the replica device 310 may have more or fewer amplifier stages. The number of amplifier stages in the replica device 310 generally matches the number of amplifier stages in the power amplifier core 302. The output of the replica device 310 is provided via a feedback loop comprising connection 312 to an error amplifier 304. The non-inverting input 306 of the error amplifier 304 is an amplifier control signal that is provided as a reference signal via connection 306. The signal on connection 146 can be either a control voltage signal or a control current signal. In the case where it is a control voltage signal, it may be converted to a control current signal and then processed into the control loop.

It is desirable to control the output amplitude of the power amplifier core 302 in a linear fashion with respect to the power amplifier control signal on connection 314. However, in a conventional nonlinear power amplifier, the amplifier responds nonlinearly with respect to changes in the value of the control input. In accordance with an embodiment of the replica linearized power amplifier 300, the output of the replica device 310 is proportional to the differential current through the power amplifier core 302. Thus, the DC current output from the replica device 310 is proportional to the RF voltage out of the power amplifier core 302. In this manner, an electrical quantity is created (in this example, the DC current) through the replica device 310 that is proportional to the electrical quantity (in this example, the RF voltage out of the power amplifier 300) whose control is desired in an indirect linear manner.

The characteristics of the power amplifier core 302 change with imbalances, such as the VSWR at the output 156, the load variation at the output 156, etc. The characteristics of the replica device 310 do not change with load variation or other imbalances on the power amplifier.

Because of the closed feedback loop controlling the replica device 310, the replica device 310 exhibits a linear response with respect to the control signal on connection 314 and can maintain the control loop with a constant dynamic. Because the output of the replica device 310 is proportional to the output of the power amplifier core 302, linearly controlling the output of the replica device indirectly allows linear control of the output of the power amplifier core 302.

The feedback, or control loop, provided by the replica device 310, connection 312 and the error amplifier 304 provides a wide control bandwidth and provides a high bandwidth linear control loop using the replica device 310 that provides low delay control of desired main electrical variable, which in this embodiment, is the RF output of the power amplifier 300.

The output of the replica device 310 is used as feedback to the error amplifier 304 so that the control node 314 of both the replica device 310 and the power amplifier core 302 is determined by the amplifier control current on connection 306. In this manner, the replica device 310 controls an output envelope of the power amplifier core 302.

FIG. 3B is a schematic diagram illustrating an example of an implementation of the replica linearized power amplifier 300 of FIG. 3A. The power amplifier core 302 includes differential transistors 376 and 378. The power amplifier core 302 also includes cascode devices 372, illustrated using transistor 382 and transistor 384. The gate-to-source capacitance Cgs of the cascode device 372 is illustrated using the capacitance 368. The transistors 376, 378, 382 and 384 are illustrated as field effect transistors (FETs) as an example only. Other semiconductor switching device technology may alternatively be used.

The replica device 310 is also illustrated as a FET. However, other semiconductor switching device technology may alternatively be used. The replica device 310 has its gate terminal connected to the gate terminals of the transistor 382 and the transistor 384. This node 314 forms the control node of the replica device 310 and the cascode devices 382 and 384. The cascode devices 382 and 384 control the current output of the transistors 376 and 378. The differential phase modulated RF input signal, which in this embodiment includes an in-phase (I) component and a quadrature-phase (Q) component comprising an information signal, is applied to the gate terminals of the transistors 376 and 378 so that the information signal can be amplified and transmitted as known in the art.

The error amplifier 304 includes current sources 352 and a current mirror 362. The current sources 352 provide currents Idc−Iin/2 and Idc+Iin/2. The error amplifier 304 operates as a transimpedance amplifier transforming current to voltage. The output of the replica device 310 on connection 366 is provided to another current mirror 364 to provide the correct polarity for the replica device output. The output of the error amplifier on connection 314 controls the output of the replica device 310 and the power amplifier core 302 in a linear manner.

The control loop provided by the replica device 310, connection 312 and the error amplifier 304 provides a wide control bandwidth. Scaling the replica device 310 will also scale the bandwidth of the control loop. The gate-to-source capacitance, Cgs, of the cascode device 372 is large. To achieve maximum bandwidth, the value of the capacitance 368 should be the dominant node, or pole. Therefore, the bandwidth of the control loop formed by the error amplifier 304 and the replica device 310 is determined by the amount of current that is required to charge the capacitance 368. Therefore, the bandwidth of the control loop is determined by the size of the replica device. In this example, where the output amplitude of the replica controlled power amplifier 300 is controlled inside the closed inner and outer AM control loops (FIG. 2) it is important for stability reasons that the bandwidth of the replica controlled power amplifier 300 is significantly wider than that of the inner and outer AM correction loops. Therefore, the bandwidth of the replica control loop is designed to be 20 MHz or more, corresponding to a factor of approximately 10 greater than the bandwidth of the outer AM correction loop.

Figure 4:
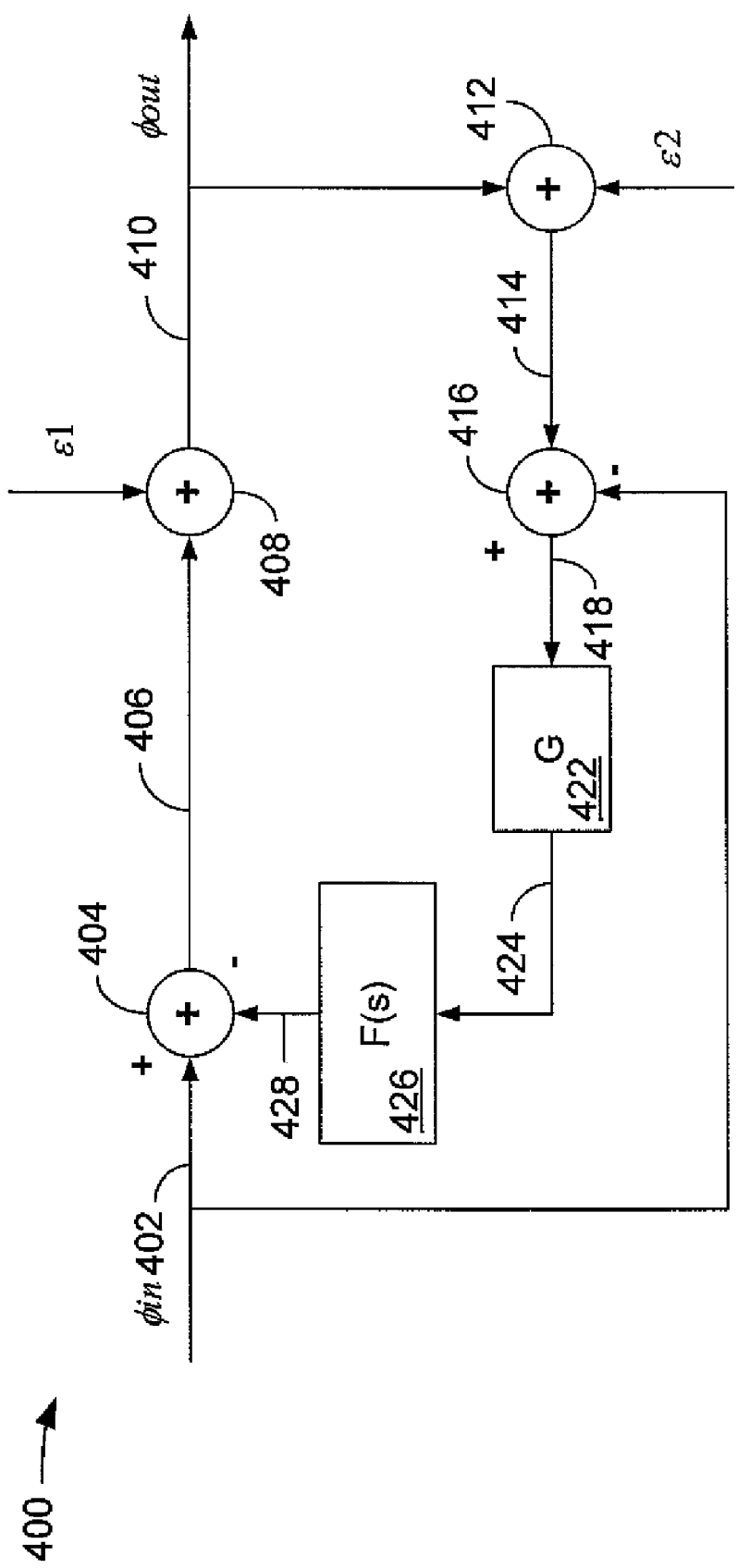
FIG. 4 is a schematic diagram illustrating an example of the control characteristics of a control loop.

FIG. 4 is a schematic diagram illustrating an example of the control characteristics of a control loop. The control loop 400 illustrated in FIG. 4 is representative of the phase correction loop 230 as well as the operation of the outer AM correction loop 210 if the gain of the VGA 248 is assumed constant, i.e., in the case where the inner AM correction loop 220 is inactive.

The operation of the phase correction loop 230 can be describes as follows: An input signal having a phase, $\phi in$, is supplied via connection 402 to an adder 404. The output of the adder 404 is supplied via connection 406 to another adder 408. Another input to the adder 408 is a signal, $\epsilon 1$, representing the phase distortion generated by the power amplifier. The output of the adder 408 on connection 410 is the output signal, $\phi out$, which is also supplied as a feedback signal to an adder 412. Another input to the adder 412 is the signal, $\epsilon 2$, representing phase distortion and phase noise of the limiter. The output of the adder 412 is supplied via connection 414 to an adder 416. Another input to the adder 416 is the input signal, $\phi in$. The output of the adder 416 on connection 418 is supplied to a gain element 422. The output of the gain element 422 is supplied via connection 424 to an element 426 having a frequency response, F(s). The output of the element 426 on connection 428 is another input to the adder 404. The response of the control loop 400 is given by:

$$\phi out/\phi in = 1$$

$$\phi out/\epsilon 1 = 1/1 + GF(s)$$

$$\phi out/\epsilon 2 = GF(s)/1 + GF(s)$$

Figure 5:
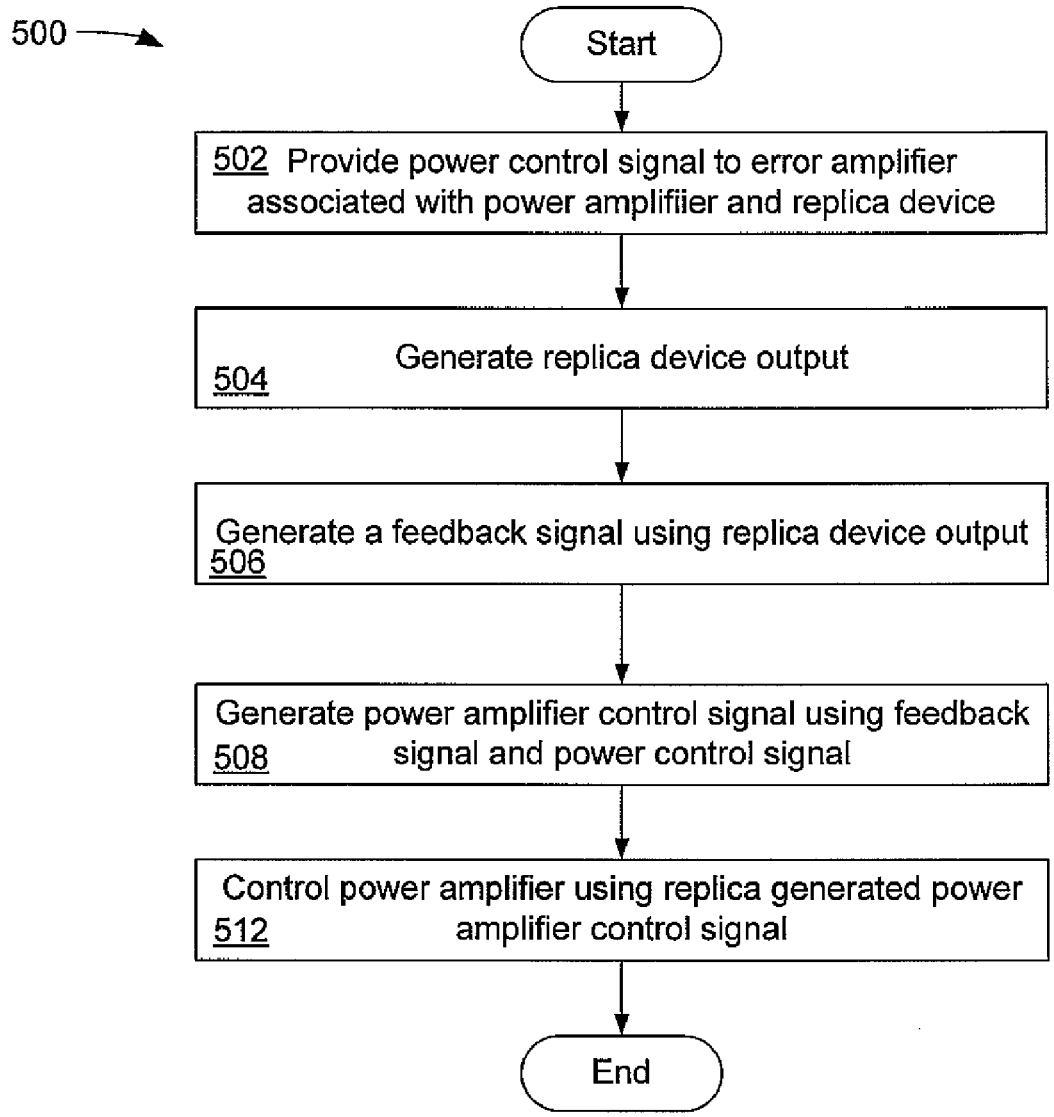
FIG. 5 is a flow chart illustrating the operation of an embodiment of the replica linearized power amplifier.

FIG. 5 is a flow chart illustrating the operation of an embodiment of the replica linearized power amplifier 300. The blocks in the flowchart can be performed in the order shown, out of the order shown, or can be performed in parallel. In block 502, a power control signal is provided to the error amplifier 304 (FIG. 3A). In block 504, the replica device 310 (FIG. 3A) generates an output signal. In block 506, a feedback signal is generated using the output of the replica device (FIG. 3A). In block 508, a power amplifier control signal is generated on connection 314 using the feedback signal and the power control signal on connection 306. In block 512, the power amplifier is controlled using the replica-device generated power amplifier control signal.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A power amplifier, comprising:
    a power amplifier core in which a transmit signal having an amplitude-modulated (AM) component and a phase-modulated (PM) component is passed and amplified, the power amplifier comprising a forward path;
    a feedback loop comprising an additional amplification device and an error amplifier, where no input of the feedback loop is connected to any output of the power amplifier, where the additional amplification device is a replica of the power amplifier core and generates a feedback signal that is provided as an input to the error amplifier, and where the error amplifier receives a power control signal as a second input, and where the error amplifier generates a power amplifier control signal; and
    wherein the feedback signal is proportional to an output of the power amplifier core, and wherein the power amplifier control signal generated by the error amplifier is provided to an amplification control input of the power amplifier core and an amplification control input of the additional amplification device to simultaneously control the power amplifier core and the additional amplification device such that the output of the additional amplification device indirectly and linearly controls the output of the power amplifier core in which an electrical quantity of the power amplifier core is a radio frequency (RF) voltage signal that is controlled using a current provided by the additional amplification device.

2. The power amplifier of claim 1, further comprising an error amplifier configured to receive a reference signal and the output of the additional amplification device, and configured to generate a power amplifier control signal that is substantially immune to load variations at the output of the power amplifier core.

3. The system of claim 1, in which the power amplifier core exhibits an approximately linear control characteristic.

4. The system of claim 2, in which the error amplifier and the additional amplification device comprise a feedback loop configured to provide indirect linear control of the power amplifier core using the output of the additional amplification device.

5. The system of claim 4, in which the power amplifier core further comprises a cascode device having a capacitance that is a dominant pole of the feedback loop, thereby maximizing a bandwidth of the feedback loop.

6. The system of claim 4, in which the additional amplification device controls an output envelope of the power amplifier core.

7. A method for controlling the power output of a power amplifier, comprising:
    providing a power control signal to an error amplifier, the error amplifier associated with a power amplifier and with an additional amplification device that is a replica of the power amplifier;
    generating an electrical output of the additional amplification device;
    providing the output of the additional amplification device to the error amplifier as a feedback signal in a feedback loop;
    generating in the error amplifier a power amplifier control signal using the feedback signal and the power control signal; and
    simultaneously controlling the power amplifier and the additional amplification device by providing the power amplifier control signal to an amplification control input of the power amplifier core and an amplification control input of the additional amplification device, wherein no input of the feedback loop is connected to any output of the power amplifier, wherein the power amplifier control signal linearly controls the additional amplification device, thereby linearly controlling the power amplifier, whereby a radio frequency (RF) voltage signal output of the power amplifier is indirectly controlled using a current provided by the additional amplification device.

8. The method of claim 7, in which the power amplifier control signal is substantially immune to load variations at an output of the power amplifier.

9. The method of claim 7, in which the power amplifier exhibits an approximately linear control characteristic.

10. The method of claim 8, in which the error amplifier and the additional amplification device comprise a feedback loop configured to provide indirect linear control of the power amplifier core using the output of the additional amplification device.

11. The method of claim 10, in which the power amplifier further comprises a cascode device having a capacitance that is a dominant pole of the feedback loop, thereby maximizing a bandwidth of the feedback loop.

12. The method of claim 10, further comprising using the additional amplification device to control an output envelope of the power amplifier.

13. A portable transceiver having a system for controlling the power output of a power amplifier, comprising:
    a transmitter coupled to a receiver;
    a power amplifier core in which a transmit signal having an amplitude-modulated (AM) component and a phase-modulated (PM) component is passed and amplified, the power amplifier comprising a forward path;
    a feedback loop comprising an additional amplification device and an error amplifier, where no input of the feedback loop is connected to any output of the power amplifier, where the additional amplification device is a replica of the power amplifier core and generates a feedback signal that is provided as an input to the error amplifier, and where the error amplifier receives a power control signal as a second input, and where the error amplifier generates a power amplifier control signal; and
    wherein the feedback signal is proportional to an output of the power amplifier core, and wherein the power amplifier control signal generated by the error amplifier is provided to an amplification control input of the power amplifier core and an amplification control input of the additional amplification device to simultaneously control the power amplifier core and the additional amplification device such that the output of the additional amplification device indirectly and linearly controls the output of the power amplifier core in which an electrical quantity of the power amplifier core is a radio frequency (RF) voltage signal that is controlled using a current provided by the additional amplification device.

14. The portable transceiver of claim 13, further comprising an error amplifier configured to receive a reference signal and the output of the additional amplification device, and configured to generate a power amplifier control signal that is substantially immune to load variations at the output of the power amplifier core.

15. The portable transceiver of claim 13, in which the power amplifier core exhibits an approximately linear control characteristic.

16. The portable transceiver of claim 14, in which the error amplifier and the additional amplification device comprise a feedback loop configured to provide indirect linear control of the power amplifier core using the output of the additional amplification device.

17. The portable transceiver of claim 16, in which the power amplifier core further comprises a cascode device having a capacitance that is a dominant pole of the feedback loop, thereby maximizing a bandwidth of the feedback loop.

* * * * *